(12) United States Patent
Choi et al.

(10) Patent No.: US 11,289,397 B2
(45) Date of Patent: Mar. 29, 2022

(54) HEAT SINK BOARD FOR A SEMICONDUCTOR DEVICE

(71) Applicant: JMJ Korea Co., Ltd., Bucheon-si (KR)

(72) Inventors: Yun Hwa Choi, Bucheon-si (KR); Young Hun Kim, Incheon (KR); Jeonghun Cho, Goyang-si (KR); So Young Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 0 days.

(21) Appl. No.: 16/995,825

(22) Filed: Aug. 18, 2020

(65) Prior Publication Data

US 2021/0143076 A1    May 13, 2021

(30) Foreign Application Priority Data

Nov. 8, 2019    (KR) .................. 10-2019-0142372

(51) Int. Cl.

| H01L 23/495 | (2006.01) |
| H01L 23/48 | (2006.01) |
| H01L 21/00 | (2006.01) |
| H05K 7/20 | (2006.01) |
| H05K 7/18 | (2006.01) |
| H01L 23/367 | (2006.01) |

(Continued)

(52) U.S. Cl.
CPC ........ *H01L 23/367* (2013.01); *H01L 21/4871* (2013.01); *H01L 21/56* (2013.01); *H01L 23/32* (2013.01); *H01L 23/3736* (2013.01); *H01L 23/48* (2013.01); *H01L 23/562* (2013.01); *H01L 24/29* (2013.01); *H01L 24/37* (2013.01); *H01L 25/072* (2013.01)

(58) Field of Classification Search
CPC . H01L 23/495; H01L 23/367; H01L 23/3736; H01L 23/562; H01L 23/3735; H01L 21/4871; H01L 21/56; H01L 25/072; H01L 29/7395; H01L 23/49822; H01L 24/48; H01L 24/32; H01L 24/40; H01L 24/29; H01L 24/37; H01L 24/49; H01L 2924/01047; H01L 2924/181
See application file for complete search history.

(56) References Cited

U.S. PATENT DOCUMENTS 6,310,401 B1 * 10/2001 Stoisiek ............ H01L 23/49838
257/664
7,535,092 B2 * 5/2009 Yokozuka ............... H01L 24/29
257/688

(Continued)

FOREIGN PATENT DOCUMENTS

| JP | 2016-092126 A | 5/2016 |
| JP | 2017-005129 A | 1/2017 |

(Continued)

*Primary Examiner* — Alonzo Chambliss
(74) *Attorney, Agent, or Firm* — Park, Kim & Suh, LLC

(57) ABSTRACT

A semiconductor package according to an embodiment of the present invention includes: a heat sink board including an insulated board and a first metal layer formed on the insulated board; at least one semiconductor chip placed on the first metal layer; a plurality of lead frames connected to the semiconductor chips used to electrically connect the semiconductor chips to the outside; and a package housing partially covering the heat sink board, wherein both end parts of the insulated board are projected further than both end parts of the first metal layer.

16 Claims, 5 Drawing Sheets

(51) Int. Cl.
*H01L 23/373* (2006.01)
*H01L 21/48* (2006.01)
*H01L 23/00* (2006.01)
*H01L 25/07* (2006.01)
*H01L 23/32* (2006.01)
*H01L 21/56* (2006.01)

(56) References Cited

U.S. PATENT DOCUMENTS

| | | | |
|---|---|---|---|
| 2006/0057768 A1* | 3/2006 | Nakanishi | H01L 23/3732 |
| | | | 438/106 |
| 2006/0192291 A1* | 8/2006 | Yokozuka | H01L 24/33 |
| | | | 257/776 |
| 2011/0073984 A1* | 3/2011 | Lee | H01L 23/4334 |
| | | | 257/467 |
| 2013/0049204 A1* | 2/2013 | Oeschler | H01L 23/04 |
| | | | 257/772 |
| 2013/0134572 A1* | 5/2013 | Lenniger | H01L 24/40 |
| | | | 257/690 |
| 2014/0138710 A1* | 5/2014 | Ohtsu | H01L 23/3735 |
| | | | 257/77 |
| 2014/0273349 A1* | 9/2014 | Lim | H01L 24/05 |
| | | | 438/108 |
| 2021/0118768 A1* | 4/2021 | Choi | H01L 21/4871 |

FOREIGN PATENT DOCUMENTS

| | | |
|---|---|---|
| WO | 2013/021750 A1 | 2/2013 |
| WO | 2014/030659 A1 | 2/2014 |

* cited by examiner

__US 11,289,397 B2__

HEAT SINK BOARD FOR A SEMICONDUCTOR DEVICE

CROSS-REFERENCE TO RELATED PATENT APPLICATION

This application claims the benefit of Korean Patent Application No. 10-2019-0142372, filed on Nov. 8, 2019, in the Korean Intellectual Property Office, the disclosure of which is incorporated herein in its entirety by reference.

BACKGROUND OF THE INVENTION

1. Field of the Invention

The present invention relates to a heat sink board, a manufacturing method thereof, and a semiconductor package including the heat sink board, and more particularly, to a heat sink board, which may reduce damage occurring due to external shock and manufacturing costs, a manufacturing method thereof, and a semiconductor package including the heat sink board.

2. Description of the Related Art

In general, a semiconductor package includes a printed circuit board (PCB), a semiconductor chip formed on the PCB, a lead frame electrically connecting the semiconductor chip to the outside through wire bonding, and a package housing covering the PCB.

Here, the PCB may be used as a heat sink board for releasing heat generated from the semiconductor chip to the outside. The heat sink board may generally include a ceramic insulated board and upper and lower metal layers respectively formed on upper and lower parts of the ceramic insulated board. In such a heat sink board, both end parts of the ceramic insulated board interposed between the upper metal layer and the lower metal layer are projected further than both end parts of the upper metal layer and the lower metal layer for releasing heat.

Accordingly, the ceramic insulated board projected further toward the outside than the upper metal layer and the lower metal layer may be easily damaged by external shock.

Also, since a thickness of the ceramic insulated board used to release heat needs to be 200 um to 300 um, a thickness of the heat sink board increases and thus, manufacturing costs also increase. In addition, when an additional heat sink board is attached below a heat sink layer in order to release more heat, a thickness of the heat sink board increases more and thereby, manufacturing costs also increase.

SUMMARY OF THE INVENTION

The present invention provides a heat sink board, which may reduce damage occurring due to external shock and manufacturing costs, a manufacturing method thereof, and a semiconductor package including the heat sink board.

According to an aspect of the present invention, there is provided a heat sink board including: an insulated board; and a first metal layer formed on the insulated board, wherein both end parts of the insulated board are projected further than both end parts of the first metal layer.

The heat sink board may further include a second metal layer formed on the first metal layer, wherein both end parts of the second metal layer and the both end parts of the first metal layer may be placed at same imaginary lines and the both end parts of the insulated board may be placed at an outer side compared with the both end parts of the first metal layer.

The second metal layer may include a plurality of stacked sub metal layers.

The end part of the insulated board may be projected further toward the outside than the end part of the first metal layer by 5 um to 8 cm.

The first metal layer may include any one selected from silver (Ag) and an alloy including above 50% of silver (Ag).

Any one of the first metal layer and the second metal layer may include any one selected from nickel (Ni), copper (Cu), and an alloy including above 50% of nickel (Ni) or copper (Cu).

The insulated board may have a thickness greater than a thickness of the first metal layer.

The thickness of the insulated board may be 0.1 mm to 10 mm.

The thickness of the first metal layer may be 1 um to 100 um.

According to another aspect of the present invention, there is provided a method of manufacturing a heat sink board including: forming a first metal layer on an insulated board by using a plating process or a sputtering process, wherein both end parts of the insulated board may be projected further than both end parts of the first metal layer.

The first metal layer may have a thickness of 1 um to 100 um.

According to another aspect of the present invention, there is provided a semiconductor package including: a heat sink board including an insulated board and a first metal layer formed on the insulated board; at least one semiconductor chip placed on the first metal layer; a plurality of lead frames connected to the semiconductor chips used to electrically connect the semiconductor chips to the outside; and a package housing partially covering the heat sink board, wherein both end parts of the insulated board are projected further than both end parts of the first metal layer.

The semiconductor package may further include a second metal layer formed on the first metal layer, wherein both end parts of the second metal layer and the both end parts of the first metal layer may be placed at same imaginary lines and the both end parts of the insulated board may be placed at an outer side compared with the both end parts of the first metal layer.

The first metal layer may include any one selected from silver (Ag) and an alloy including above 50% of silver (Ag).

Any one of the first metal layer and the second metal layer may include any one selected from nickel (Ni), copper (Cu), and an alloy including above 50% of nickel (Ni) or copper (Cu).

The insulated board may have a thickness greater than a thickness of the first metal layer.

The thickness of the insulated board may be 0.1 mm to 10 mm.

The thickness of the first metal layer may be 1 um to 100 um.

The heat sink board may have more than 50% of area exposed to the outside of the package housing.

The semiconductor package may further include a plurality of connecting means electrically connecting each of the plurality of semiconductor chips, wherein the connecting means comprise a metal clip or a metal spacer and are attached to chip pads of the semiconductor chips.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

Figure 1:
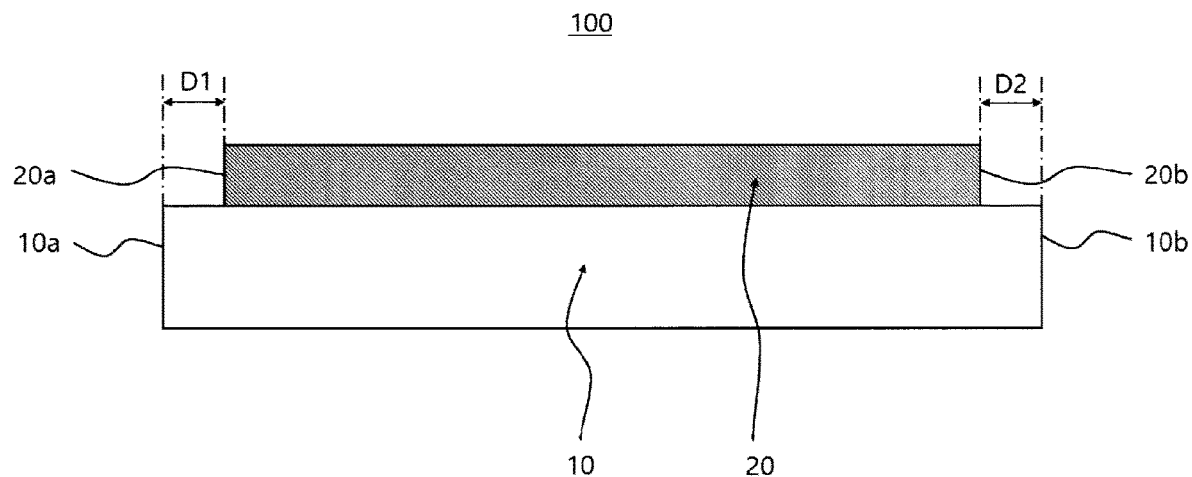
FIG. 1 is a cross-sectional view of a heat sink board according to an embodiment of the present invention.
Figure 2:
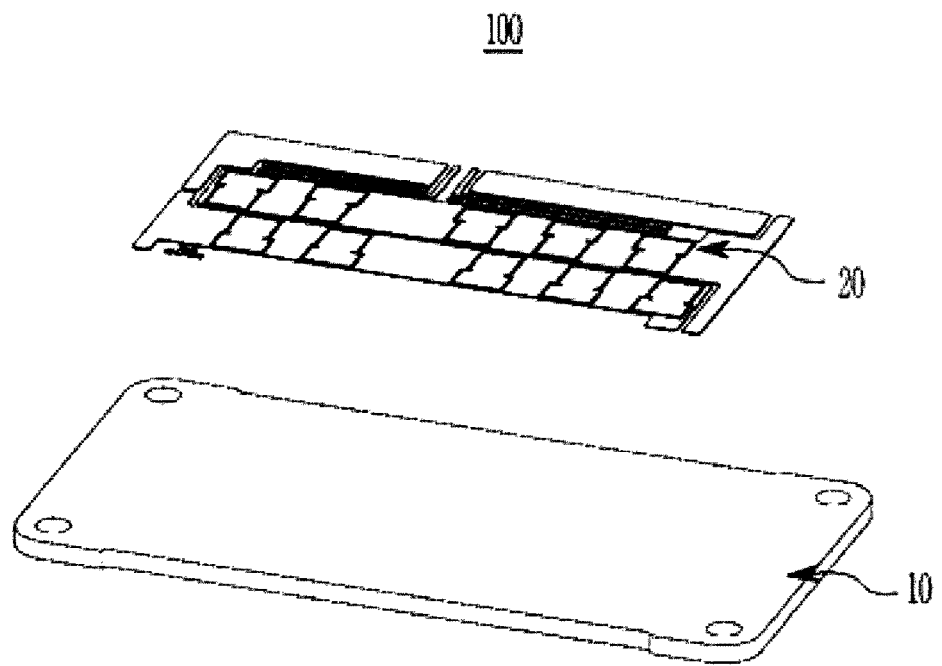
FIG. 2 is a perspective view of a heat sink board according to an embodiment of the present invention.

FIG. 1 is a cross-sectional view of a heat sink board 100 according to an embodiment of the present invention and FIG. 2 is a perspective view of the heat sink board 100 according to an embodiment of the present invention.

As illustrated in FIGS. 1 and 2, the heat sink board 100 according to an embodiment of the present invention includes an insulated board 10 and a first metal layer 20 formed on the insulated board 10.

The insulated board 10 may include any one selected from ceramic ($Al_2O_3$), aluminum nitride (AlN), silicon nitride ($Si_3N_4$), aluminum silicon carbide (AlSiC), silicon carbide (SiC), zirconium (Zr), and a mixture thereof. A thickness of the insulated board 10 may be 0.1 mm to 10 mm.

The first metal layer 20 may include any one selected from a single metal including silver (Ag) and an alloy including above 50% of silver (Ag). Also, the first metal layer 20 may include any one selected from a single metal including nickel (Ni), a single metal including copper (Cu), and an alloy including above 50% of nickel (Ni) or copper (Cu).

A thickness of the first metal layer 20 may be 1 um to 100 um. As such, the thickness of the first metal layer 20 may be thinner than the thickness of the insulated board 10 so that heat emission effect may be greatly increased.

Both end parts 10a and 10b of the insulated board 10 may be projected further toward the outside than both end parts 20a and 20b of the first metal layer 20.

Here, the end part 10a of the insulated board 10 may be projected further toward the outside than the end part 20a of the first metal layer 20 by a first projected length D1 of 5 um to 8 cm. As in the same manner, the other end part 10b of the insulated board 10 may be projected further toward the outside than the other end part 20b of the first metal layer 20 by a second projected length D2 of 5 um to 8 cm.

Here, the first projected length D1 and the second projected length D2 may be the same or different from each other.

According to an embodiment of the present invention, the first metal layer 20 is only formed on the insulated board 10, however, a second metal layer 30 may be formed on the first metal layer 20 in another embodiment of the present invention.

Hereinafter, the heat sink board 100 according to another embodiment of the present invention will be described in detail with reference to FIG. 3.

Figure 3:
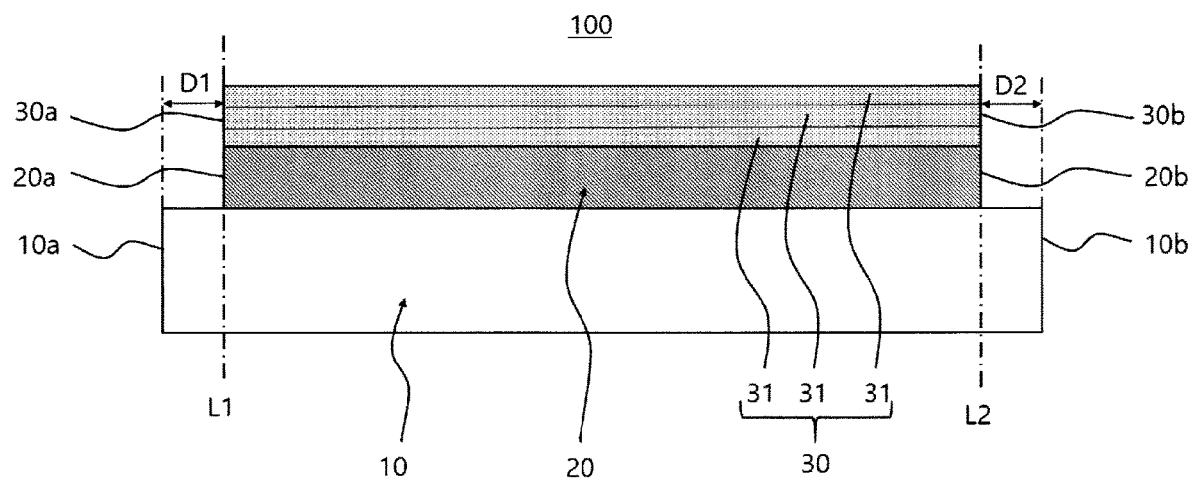
FIG. 3 is a cross-sectional view of a heat sink board according to another embodiment of the present invention.

FIG. 3 is a cross-sectional view of the heat sink board 100 according to another embodiment of the present invention.

The description in the embodiment illustrated in FIG. 3 is the same as that of in the embodiment illustrated in FIGS. 1 and 2 except for structures of the second metal layer 30 and thus, the same description is omitted herein.

As illustrated in FIG. 3, the heat sink board 100 according to another embodiment of the present invention includes the insulated board 10, the first metal layer 20 formed on the insulated board 10, and the second metal layer 30 formed on first metal layer 20.

Here, the both end parts 20a and 20b of the first metal layer 20 and both end parts 30a and 30b of the second metal layer 30 may be placed at the same imaginary lines L1 and L2.

A thickness of the insulated board 10 may be 0.1 mm to 10 mm. Also, the both end parts 10a and 10b of the insulated board 10 may be projected further toward the outside than the both end parts 20a and 20b of the first metal layer 20. As in the same manner, the both end parts 10a and 10b of the insulated board 10 may be projected further toward the outside than the both end parts 30a and 30b of the second metal layer 30.

Here, the end part 10a of the insulated board 10 may be projected further toward the outside than the end part 20a of the first metal layer 20 or the end part 30a of the second metal layer 30 by the first projected length D1 of 5 um to 8 cm. As in the same manner, the other end part 10b of the insulated board 10 may be projected further toward the outside than the other end part 20b of the first metal layer 20 or the other end part 30b of the second metal layer 30 by the second projected length D2 of 5 um to 8 cm. Here, the first projected length D1 and the second projected length D2 may be the same or different from each other.

The second metal layer 30 may include a plurality of stacked sub metal layers 31. In the embodiment of FIG. 3, three sub metal layers 31 are illustrated. However, the present invention is not limited thereto and various numbers of sub metal layer 31 may be formed.

The thickness of the first metal layer 20 and the second metal layer 30 may be respectively 1 um to 100 um. However, the present invention is not limited thereto and the sum of the thickness of the first metal layer 20 and the second metal layer 30 may be 1 um to 100 um.

Hereinafter, a method of manufacturing the heat sink board 100 illustrated in FIG. 3 above will be described in detail.

Figure 4:
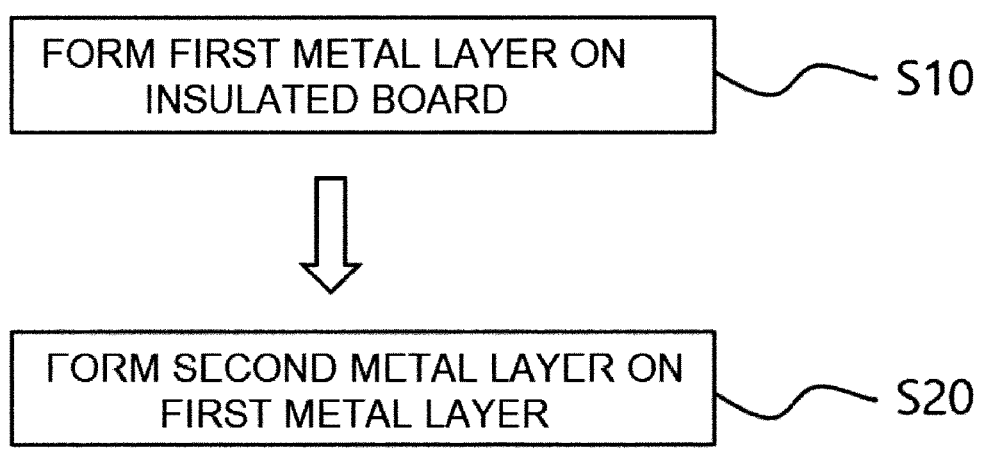
FIG. 4 is a flowchart illustrating a method of manufacturing a heat sink board according to another embodiment of the present invention.

FIG. 4 is a flowchart illustrating a method of manufacturing the heat sink board 100 according to another embodiment of the present invention.

As illustrated in FIG. 4, the method of manufacturing the heat sink board 100 firstly includes forming of the first metal layer 20 having a small thickness on the insulated board 10 by using a plating process or a sputtering process, in operation S10. The plating process may include electroplating or electroless plating. Since the first metal layer 20 is formed by using a plating process or a sputtering process, the first metal layer 20 having a reduced thickness may be formed and thus, manufacturing costs may be reduced so that heat emission effect may be greatly increased.

Here, the both end parts 10a and 10b of the insulated board 10 may be projected further toward the outside than the both end parts 20a and 20b of the first metal layer 20.

Next, the second metal layer 30 may be formed on the first metal layer 20 by using a plating process or a sputtering process, in operation S20. Here, the both end parts 20a and 20b of the first metal layer 20 and the both end parts 30a and 30b of the second metal layer 30 may be placed at the same imaginary lines L1 and L2.

As described above, when the first metal layer 20 and the second metal layer 30 are both formed by using a plating process or a sputtering process, the first metal layer 20 and the second metal layer 30 may have a reduced thickness so that manufacturing costs may be reduced and heat emission effect may be greatly increased.

Figure 5:
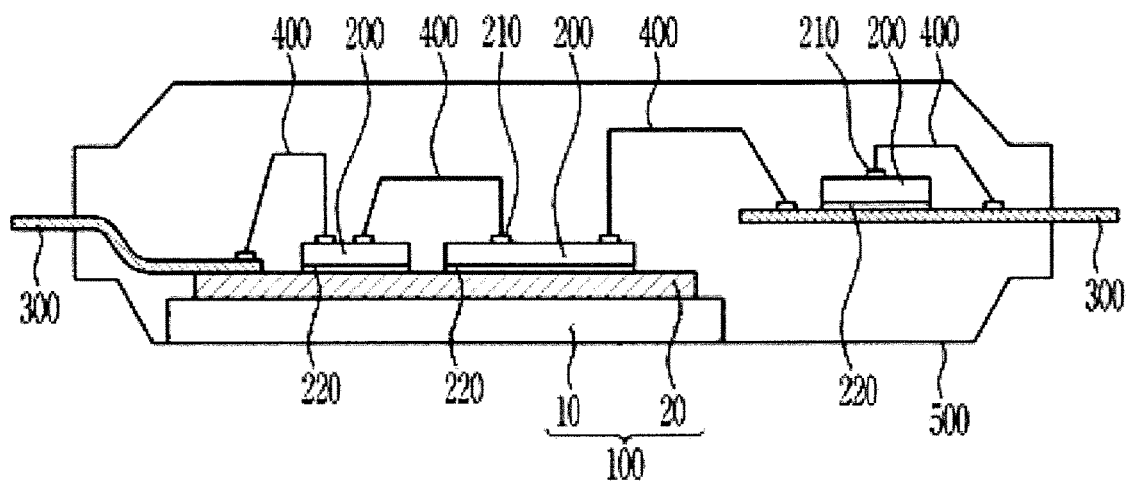
FIG. 5 is a cross-sectional view of a semiconductor package according to an embodiment of the present invention.
Figure 6:
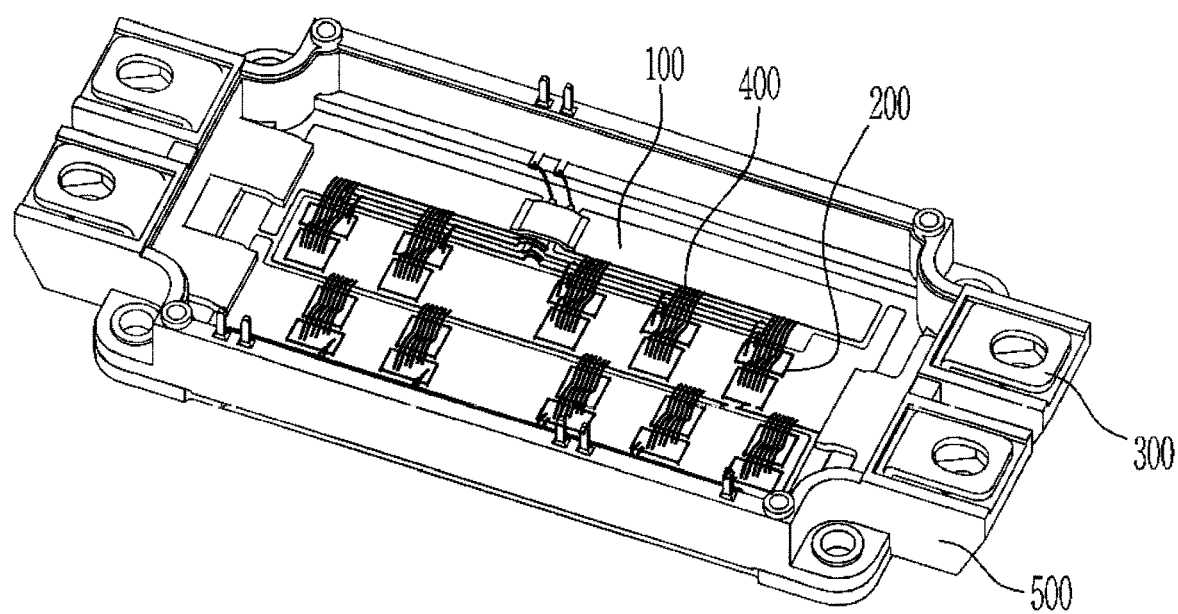
FIG. 6 is a perspective view of a semiconductor package according to an embodiment of the present invention.
Figure 7:
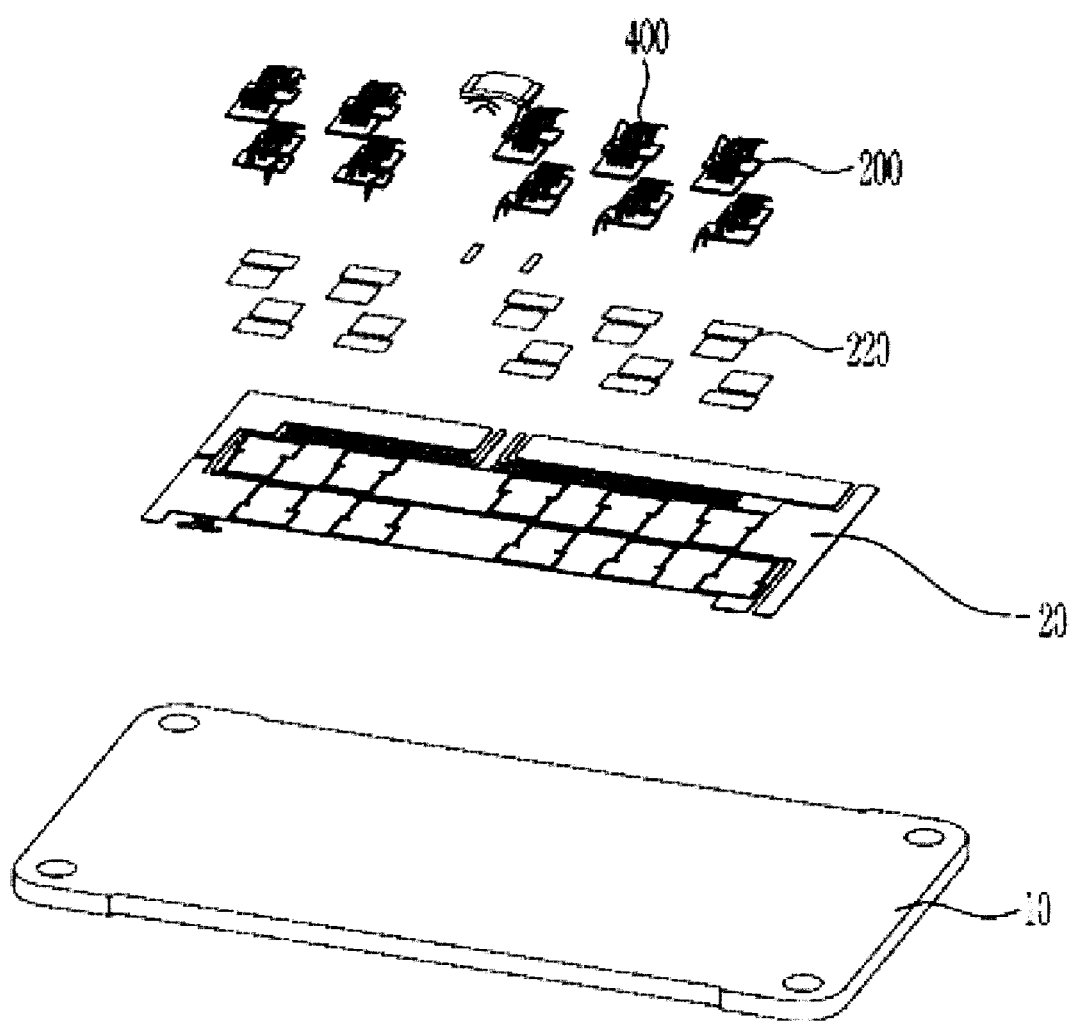
FIG. 7 is an exploded perspective view of a part in FIG. 6.
Figure 8:
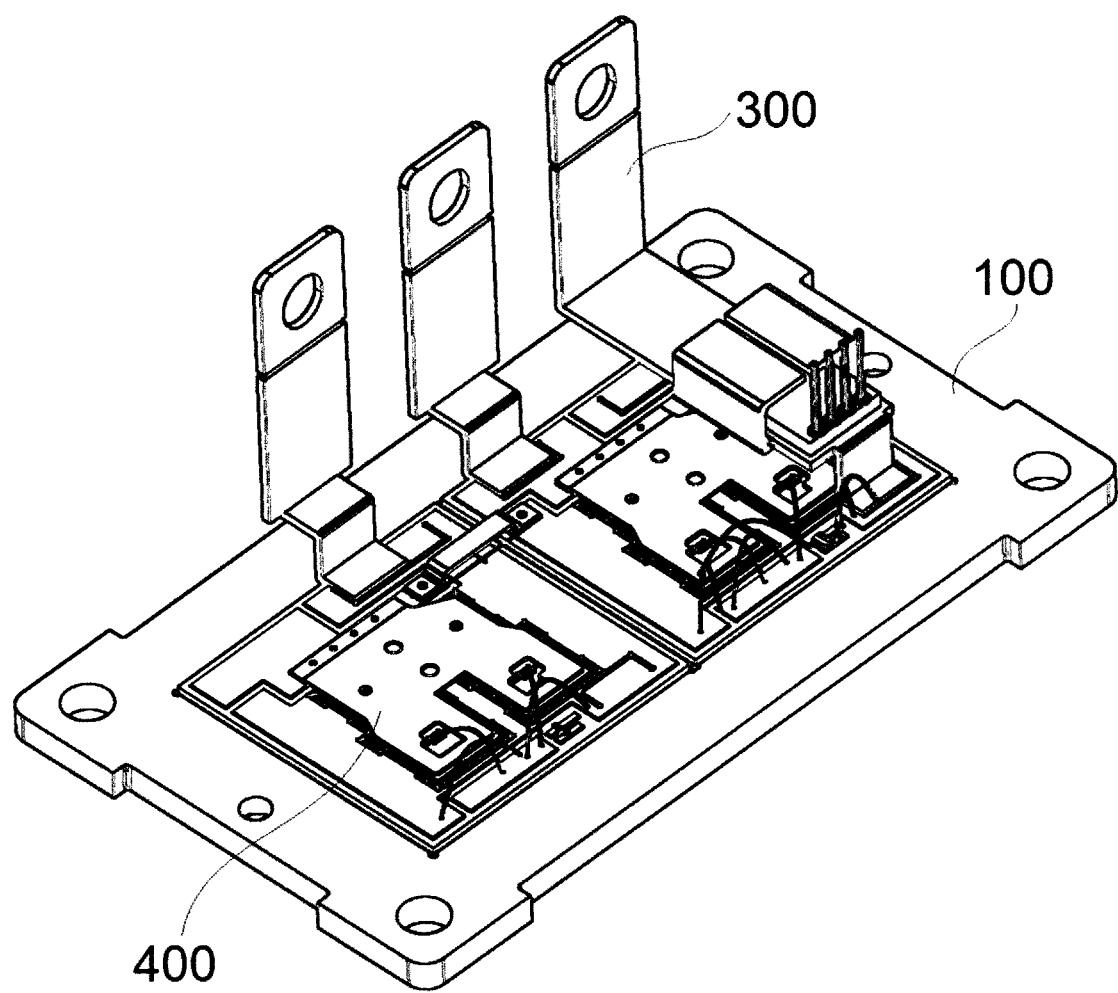
FIG. 8 is an enlarged perspective view of a metal clip connected to a lead frame illustrated in FIG. 6.

FIG. 5 is a cross-sectional view of a semiconductor package according to an embodiment of the present invention, FIG. 6 is a perspective view of a semiconductor package according to an embodiment of the present invention, FIG. 7 is an exploded perspective view of a part in FIG. 6, and FIG. 8 is an enlarged perspective view of a metal clip connected to a lead frame illustrated in FIG. 6.

As illustrated in FIGS. 5 through 8, a semiconductor package according to an embodiment of the present invention includes the heat sink board 100, at least one semiconductor chip 200, a plurality of lead frames 300, a plurality of connecting members 400, and a package housing 500.

The heat sink board 100 includes the insulated board 10 and the first metal layer 20 formed on the insulated board 10. In the current embodiment of the present invention, the first metal layer 20 is only illustrated. However, the present invention is not limited thereto and the second metal layer 30 having a plurality of sub metal layers 31 may be formed.

The insulated board 10 may include any one selected from ceramic ($Al_2O_3$), aluminum nitride (AlN), silicon nitride ($Si_3N_4$), aluminum silicon carbide (AlSiC), silicon carbide (SiC), zirconium (Zr), and a mixture thereof. A thickness of the insulated board 10 may be 0.1 mm to 10 mm.

The first metal layer 20 may include any one selected from a single metal including silver (Ag) and an alloy including above 50% of silver (Ag). Also, the first metal layer 20 may include any one selected from a single metal including nickel (Ni), a single metal including copper (Cu), and an alloy including above 50% of nickel (Ni) or copper (Cu).

A thickness of the first metal layer 20 may be 1 um to 100 um. As such, the thickness of the first metal layer 20 may be thinner than the thickness of the insulated board 10 so that heat emission effect may be greatly increased.

The both end parts 10a and 10b of the insulated board 10 may be projected further toward the outside than the both end parts 20a and 20b of the first metal layer 20. Here, the end part 10a of the insulated board 10 may be projected further toward the outside than the end part 20a of the first metal layer 20 by the first projected length D1 of 5 um to 8 cm. As in the same manner, the other end part 10b of the insulated board 10 may be projected further toward the outside than the other end part 20b of the first metal layer 20 by the second projected length D2 of 5 um to 8 cm. Here, the first projected length D1 and the second projected length D2 may be the same or different from each other.

The heat sink board 100 according to an embodiment of the present invention illustrated in FIGS. 5 through 8 is applied from the heat sink board 100 illustrated in FIGS. 1 and 2. However, the present invention is not limited thereto and the heat sink board 100 according to another embodiment of the present invention illustrated in FIG. 3 may be applicable.

As illustrated in FIGS. 5 through 8, the semiconductor chips 200 may be placed on the first metal layer 20. Such semiconductor chips 200 may be attached to the first metal layer 20 by using an adhesive means 220 through a soldering process, a silver (Ag) sintering process, or a copper (Cu) sintering process.

The semiconductor chips 200 may include any one selected from metal-oxide semiconductor filed effect transistor (MOSFET), insulated gate bipolar transistor (IGBT), and diode. Such semiconductor chips 200 may be formed of any one selected from silicon (Si), silicon carbide (SiC), and gallium nitride (GaN). The semiconductor chips 200 may include a chip pad 210 used to electrically connect to connecting means 400.

The plurality of connecting means 400 may be used to electrically connect each of the plurality of semiconductor chips 200. Such connecting means 400 may include a metal clip or a metal spacer and FIG. 8 illustrates the connecting means 400 formed with metal clips. The connecting means 400 may be attached and electrically connected to the chip pads 210 of the semiconductor chips 200.

The lead frames 300 are connected to the semiconductor chips 200 through the plurality of connecting means 400 and electrically connect the semiconductor chips 200 to the outside.

Here, the lead frames 300 may be attached to the first metal layer 20 of the heat sink board 100 through an ultrasonic welding process without using an additional adhesive means.

The package housing 500 may partially cover the heat sink board 100 in order to protect the heat sink board 100. Here, more than 50% of area of the heat sink board 100 may be exposed to the outside of the package housing 500. Accordingly, heat emission effect may be greatly increased. Such a package housing 500 may be formed of any one selected from epoxy molding compound (EMC), polybutylene terephthalate (PBT), and polyphenylene sulfide (PPS).

In the heat sink board and the semiconductor package including the heat sink board according to an embodiment of the present invention, the metal layers are formed on the insulated board by using a plating process or a sputtering process and thus, manufacturing costs may be reduced.

In addition, since the metal layers are formed by using a plating process or a sputtering process, the metal layers may have reduced thicknesses and thus, heat emission effect may be greatly increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A heat sink board comprising:
an insulated board;
a first metal layer formed on the insulated board, wherein ends of the insulated board are projected further than ends of the first metal layer, respectively; and
a second metal layer formed on the first metal layer, wherein the ends of the first metal layer are aligned with ends of the second metal layer, respectively,
wherein the insulated board has a thickness greater than a sum of thicknesses of the first and second metal layers, wherein the sum of the thicknesses of the first and second metal layers is 1 micrometer to 100 micrometers,
wherein materials of the first and second metal layers are different from each other.

2. The heat sink board of claim 1, wherein the second metal layer comprises a plurality of stacked sub metal layers.

3. The heat sink board of claim 1, wherein the ends of the insulated board are projected further toward the outside than the ends of the first metal layer by 5 micrometers to 8 cm.

4. The heat sink board of claim 1, wherein the first metal layer comprises any one selected from silver (Ag) and an alloy comprising above 50% of silver (Ag).

5. The heat sink board of claim 1, wherein any one of the first metal layer and the second metal layer comprises any one selected from nickel (Ni), copper (Cu), and an alloy comprising above 50% of nickel (Ni) or copper (Cu).

6. The heat sink board of claim 1, wherein the thickness of the insulated board is 0.1 mm to 10 mm.

7. The heat sink board of claim 1, wherein the second metal layer is configured to be directly attached to a lower surface of a semiconductor chip.

8. A method of manufacturing a heat sink board comprising:
   forming a first metal layer on an insulated board by using a plating process or a sputtering process; and
   forming a second metal layer on the first metal layer, ends of the first metal layer being aligned with ends of the second metal layer, respectively,
   wherein ends of the insulated board are projected further than the ends of the first metal layer,
   wherein the insulated board has a thickness greater than a sum of thicknesses of the first and second metal layers,
   wherein the sum of the thicknesses of the first and second metal layers is 1 micrometer to 100 micrometers,
   wherein materials of the first and second metal layers are different from each other.

9. The method of claim 8, further comprising attaching a semiconductor chip directly to an upper surface of the second metal layer.

10. A semiconductor package comprising:
    a heat sink board comprising an insulated board, a first metal layer formed on the insulated board, and a second metal layer formed on the first metal layer, ends of the first metal layer being aligned with ends of the second metal layer, respectively;
    at least one semiconductor chip placed on the second metal layer;
    a plurality of lead frames connected to the semiconductor chips used to electrically connect the semiconductor chips to the outside; and
    a package housing partially covering the heat sink board,
    wherein ends of the insulated board are projected further than the ends of the first metal layer, respectively,
    wherein the insulated board has a thickness greater than a sum of thicknesses of the first and second metal layers,
    wherein the sum of the thicknesses of the first and second metal layers is 1 micrometer to 100 micrometers,
    wherein materials of the first and second metal layers are different from each other.

11. The semiconductor package of claim 10, wherein the first metal layer comprises any one selected from silver (Ag) and an alloy comprising above 50% of silver (Ag).

12. The semiconductor package of claim 10, wherein any one of the first metal layer and the second metal layer comprises any one selected from nickel (Ni), copper (Cu), and an alloy comprising above 50% of nickel (Ni) or copper (Cu).

13. The semiconductor package of claim 10, wherein the thickness of the insulated board is 0.1 mm to 10 mm.

14. The semiconductor package of claim 10, wherein the heat sink board has more than 50% of area exposed to the outside of the package housing.

15. The semiconductor package of claim 10, further comprising a plurality of connecting means electrically connecting each of the plurality of semiconductor chips, wherein the connecting means comprise a metal clip or a metal spacer and are attached to chip pads of the semiconductor chips.

16. The semiconductor package of claim 10, wherein the semiconductor chip is directly attached to an upper surface of the second metal layer.

\* \* \* \* \*